(12) United States Patent
Wei et al.

(10) Patent No.: US 8,241,757 B2
(45) Date of Patent: Aug. 14, 2012

(54) MULTILAYER SUBSTRATE

(75) Inventors: Chao-Tsang Wei, Taipei Hsien (TW); Chung-Pei Wang, Tucheng (TW); Chien-Hao Huang, Taipei Hsien (TW); Wei-Cheng Ling, Taipei Hsien (TW); Chia-Ying Wu, Tu-Cheng (TW); Ga-Lane Chen, Santa Clara, CA (US)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 291 days.

(21) Appl. No.: 12/606,265

(22) Filed: Oct. 27, 2009

(65) Prior Publication Data

US 2010/0151271 A1 Jun. 17, 2010

(30) Foreign Application Priority Data

Dec. 17, 2008 (CN) .......................... 2008 1 0306318

(51) Int. Cl.
*B32B 15/04* (2006.01)
*B32B 9/04* (2006.01)
*B32B 17/06* (2006.01)

(52) U.S. Cl. ........ 428/610; 428/698; 428/426; 428/408; 428/472; 428/432; 428/621; 428/457; 428/547; 428/310.5

(58) Field of Classification Search ........................ None
See application file for complete search history.

(56) References Cited

U.S. PATENT DOCUMENTS

| 5,223,350 | A | * | 6/1993 | Kobayashi et al. | ........... 428/697 |
|---|---|---|---|---|---|
| 6,087,730 | A | * | 7/2000 | McGarvey et al. | ........... 257/766 |
| 6,410,411 | B1 | * | 6/2002 | McGarvey et al. | ........... 438/592 |
| 7,621,648 | B2 | * | 11/2009 | Wuillaume et al. | ........... 359/883 |
| 2005/0136656 | A1 | * | 6/2005 | Zeng et al. | ..................... 438/680 |
| 2007/0026324 | A1 | * | 2/2007 | Yoshida et al. | .................... 430/7 |
| 2007/0098993 | A1 | * | 5/2007 | Chen | ............................. 428/408 |
| 2007/0111003 | A1 | * | 5/2007 | Chen | ............................. 428/408 |
| 2007/0116956 | A1 | * | 5/2007 | Chen | ............................. 428/408 |
| 2007/0291381 | A1 | * | 12/2007 | Wuillaume et al. | ........... 359/838 |
| 2008/0095939 | A1 | * | 4/2008 | Fischer et al. | ......... 427/255.394 |
| 2009/0120241 | A1 | * | 5/2009 | Vetter | ................................ 76/115 |
| 2009/0180725 | A1 | * | 7/2009 | Galehouse et al. | ........... 384/492 |
| 2009/0324937 | A1 | * | 12/2009 | Lev et al. | ..................... 428/336 |

* cited by examiner

*Primary Examiner* — Jennifer McNeil
*Assistant Examiner* — Vera Katz
(74) *Attorney, Agent, or Firm* — Altis Law Group, Inc.

(57) ABSTRACT

A multilayer substrate includes a base layer, a coating layer and an intermediate layer positioned between the base layer and the coating layer. The intermediate layer contains chromium and nitrogen. A content of the chromium in the intermediate layer gradually decreases from the base layer to the coating layer.

4 Claims, 3 Drawing Sheets

MULTILAYER SUBSTRATE

BACKGROUND

1. Technical Field

The present disclosure relates to a substrate and, particularly, to a multilayer substrate.

2. Description of Related Art

Film coating method typically includes an ion coating method, a magnetic sputtering method, a vacuum vapor deposition method, a chemical vapor deposition method, and etc. Recently, a multilayer film on a metallic or glass base using a reactive magnetic sputtering method is widely used to provide metallic feeling or a colorful appearance in communication or consumer electronic products.

The multilayer film of the communication or consumer electronic products should be hard and able to withstand typical wear and tear. Some methods are provided to achieve the above requirements, such as increasing the number of layers of the film or a thickness of the multilayer film. When the multilayer film is metal or alloy and the base is glass, the binding force between the multilayer film and the base may be low because of the differences of crystal lattice structures and expansion coefficients between the metal/alloy and glass. This may result in low abrasion resistances of the coating films.

What is needed, therefore, is a multilayer substrate to overcome the above shortcomings.

BRIEF DESCRIPTION OF THE DRAWINGS

Many aspects of the present multilayer substrate can be better understood with reference to the following drawings. The components in the drawings are not necessarily drawn to scale, the emphasis instead being placed upon clearly illustrating the principles of the present multilayer substrate. Moreover, in the drawings, like reference numerals designate corresponding parts throughout the several views.

DETAILED DESCRIPTION

Reference will now be made to the drawings to describe present embodiments of the multilayer substrate.

Figure 1:
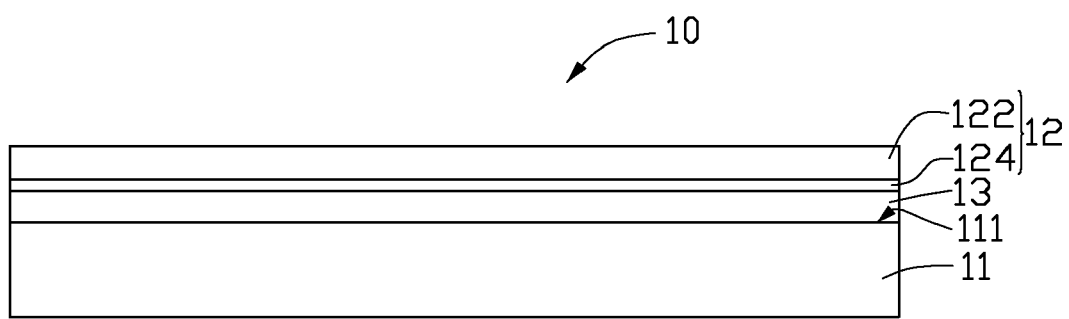
FIG. 1 shows a structure of a multilayer substrate in accordance with a first exemplary embodiment.

Referring to FIG. 1, a multilayer substrate 10 in accordance with a first embodiment includes a base layer 11, a coating layer 12 and a intermediate layer 13 sandwiched between the base layer 11 and the coating layer 12.

The base layer 11 may include a metal or an alloy. In alternative embodiments, the metal can be selected from aluminum and titanium, and the alloy can be selected from stainless steel or an alloy of aluminum and titanium. The base layer 11 has an top surface 111.

The coating layer 12 may have a single-layer structure or a multilayer structure. A material of the coating layer 12 can include a nonmetallic material, such as diamond-like carbon, glass and ceramic. The ceramic material includes a metal compound containing nitrogen, carbon or oxygen, such as titanium nitride (TiN), chromic carbide (CrC), and titanium aluminum nitride (TiAlN). The coating layer 12 provides a metallic feeling or a colorful appearance to the multilayer substrate 10. In this embodiment, the coating layer 12 has an outer layer 122 and a contact layer 124.

The intermediate layer 13 is sandwiched between the base layer 11 and the coating layer 12. A surface of the intermediate layer 13 contacts the top surface 111 of the base layer 11 and an opposite surface of the intermediate layer 13 contacts the contact layer 124 of the coating layer 12. The intermediate layer 13 essentially consists of nitride and chromium (Cr). A chemical formula of the intermediate layer 13 is: $CrN_x$, wherein the letter "x" is in the range: $0 < x \leq 1$. The chromium content of $CrN_x$ in the intermediate layer 13 gradually decreases along a direction from the top surface 111 of the base layer 11 to the contact layer 124. When the chromium content in the intermediate layer 13 is high, such as Cr without nitrogen included, the intermediate layer 13 shows metallic properties. On the other hand, when the nitride content in the intermediate 13 is high, such as a compound CrN, the intermediate layer 13 shows nonmetallic properties. Therefore, a part of the intermediate layer 13 contacting the base layer 11 shows metallic properties, which is similar to the base layer 11, so that the intermediate layer 13 can adhere to base layer 11 tightly. It is well known that the similar metallic properties include similar crystal lattice structures and similar expansion coefficients. A part of the intermediate layer 13 contacting the contact layer 124 shows nonmetallic properties, which is similar to the contact layer 124. Therefore, the intermediate layer 13 and the contact layer 124 can adhere to each other tightly. Preferably, the part of the intermediate layer 13 contacting the contact layer 124 is CrN, and the part of the intermediate layer 13 contacting the base layer 11 is Cr.

The intermediate layer 13 is formed using a vacuum sputtering method. Firstly, a base layer 11, and a Cr target are placed in position in a vacuum cavity, and then sputter gas is fed into the vacuum cavity. The sputter gas into the vacuum cavity can be a mixture of argon (Ar) and nitrogen ($N_2$). Secondly, the nitrogen gas is ionized by an electromagnetic field. Finally, the ionized nitrogen gas is combined with the Cr using a sputtering process. In this sputtering method, the ratio between the Ar gas and $N_2$ gas, and the sputtering speed can be adjusted to achieve the intermediate layer 13 with gradually decreased nitrogen content of the formula $CrN_x$.

When the ratio of $N_2$ in the mixture of Ar and $N_2$ is high, for example the feeding speed of the Ar gas is 25 cubic centimeter per minute (cu.cm/min) and the feeding speed of the $N_2$ gas is 99 cu.cm/min, the part of the intermediate layer 13 with high nitrogen content is formed. When the feeding speed of $N_2$ in the mixture of Ar gas and $N_2$ is low or no $N_2$ gas is fed, the part of the intermediate layer 13 with high Cr content is formed. The feeding speed of the $N_2$ gas can be adjusted in a range from 0 to 99 cu.cm/min.

Figure 2:
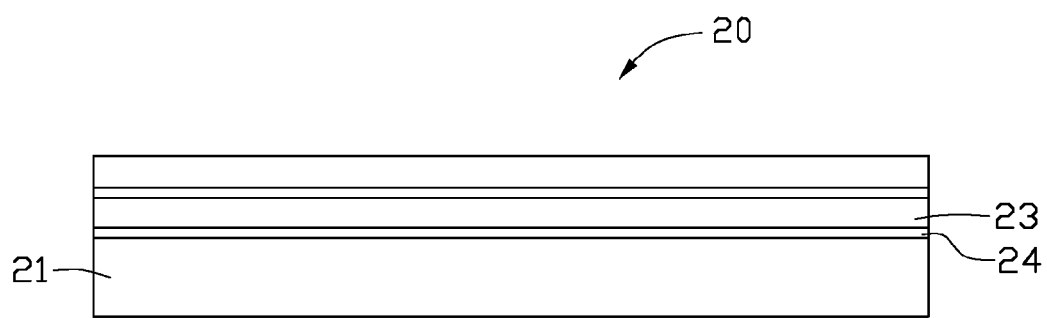
FIG. 2 shows a structure of a multilayer substrate in accordance with a second exemplary embodiment.

Referring to FIG. 2, a multilayer substrate 20 in accordance with a second embodiment is provided, differing from the multilayer substrate 10 only in that the base layer 21 of the multilayer substrate 20 is nonmetallic and a first matching layer 24 is provided between the base layer 21 and the intermediate layer 23. The nonmetallic material of the base layer 20 is selected from the group consisting of glass or ceramic. The ceramic can be a metallic compound containing nitrogen, carbon, or oxygen. A side of the first matching layer 24 contacts the base layer 21, and an opposite side contacts the intermediate layer 23. The first matching layer 24 includes a compound containing nitrogen and chromium. The nitrogen content in the first matching layer 24 is larger than the nitrogen content in the intermediating layer 23 so that the base layer 21 can adhere to the intermediate layer 23 more tightly. Preferably, the first matching layer 24 is made of CrN.

Figure 3:
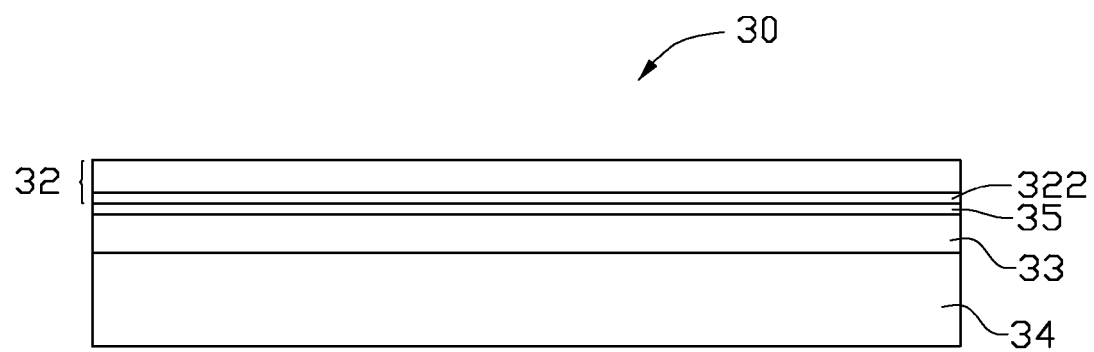
FIG. 3 shows a structure of a multilayer substrate in accordance with a third exemplary embodiment.

Referring to FIG. 3, a multilayer substrate 30 in accordance with a third embodiment is provided, differing from the multilayer substrate 10 only in that the coating layer 32 is made of a metal or an alloy, and a second matching layer 35 is provided between the contact layer 322 and the intermediate layer 33 of the multilayer substrate 30. A material of the coating layer 32 can be selected from the group consisting of aluminum, titanium and an alloy of aluminum and titanium. The second matching layer 35 may include a compound containing nitrogen and chromium. The chromium content in the second matching layer 35 is larger than the chromium content of the intermediating layer 33 so that the contact layer 322 can adhere to the intermediate layer 33 more tightly. Alternatively, the second matching layer 35 can made of chromium.

In addition, when the base layer is made of a nonmetallic material and the coating layer is made of a metallic layer, a chromium content of the intermediate layer gradually can increase from the base layer to the coating layer.

It is to be understood that the above-described embodiment is intended to illustrate rather than limit the embodiments. Variations may be made to the embodiment without departing from the spirit of the invention as claimed. The above-described embodiments are intended to illustrate the scope of the invention and not restrict the scope of the embodiments.

What is claimed is:

1. A multilayer substrate, comprising:
   a base layer;
   a coating layer; and
   an intermediate layer positioned between the base layer and the coating layer, the intermediate layer containing chromium and nitrogen, and a content of the chromium in the intermediate layer gradually decreasing from the base layer to the coating layer;
   the base layer is made of glass, and the coating layer is made of glass or ceramic, or materials of the base layer and the coating layer comprises a metal;
   wherein when the base layer is made of glass and the coating layer is made of glass or ceramic, the multilayer substrate further comprising a matching layer sandwiched between the base layer and the intermediate layer, the matching layer containing a compound of nitrogen and chromium, a content of the nitrogen in the matching layer being higher than the content of the nitrogen in the intermediate layer.

2. The multilayer substrate of claim 1, wherein a material of the matching layer is CrN.

3. A multilayer substrate, comprising:
   a base layer;
   a coating layer; and
   an intermediate layer positioned between the base layer and the coating layer, the intermediate layer containing chromium and nitrogen, and a content of the chromium in the intermediate layer gradually decreasing from the base layer to the coating layer;
   the base layer is made of glass, and the coating layer is made of glass or ceramic, or materials of the base layer and the coating layer comprises a metal;
   wherein material of the base layer is selected from aluminum, titanium, stainless steel and an alloy of aluminum and titanium, and material of the coating layer is selected from a group consisting of aluminum, titanium, and an alloy of aluminum and titanium, the multilayer substrate further comprising a matching layer sandwiched between the intermediate layer and the coating layer, the matching layer containing a compound of nitrogen and chromium, a content of the chromium in the matching layer being higher than the content of the chromium in the intermediate layer.

4. A multilayer substrate, comprising:
   a first metallic layer;
   a second layer comprising a metal;
   an intermediate layer positioned between the first metallic layer and the second layer, the intermediate layer containing chromium and nitrogen, and the content of the chromium in the intermediate layer gradually decreasing from the first metallic layer to the second layer;
   wherein material of the second layer is selected from a group consisting of aluminum, titanium, and an alloy of aluminum and titanium, the multilayer substrate further comprising a matching layer sandwiched between the intermediate layer and the second layer, the matching layer containing a compound of nitrogen and chromium, a content of the chromium in the matching layer being higher than the content of the chromium in the intermediate layer.

* * * * *